(12) United States Patent
Hopper et al.

(10) Patent No.: US 6,576,545 B1
(45) Date of Patent: Jun. 10, 2003

(54) SEMICONDUCTOR DEVICES WITH DUAL NATURE CAPPING/ARC LAYERS ON FLUORINE DOPED SILICA GLASS INTER-LAYER DIELECTRICS AND METHOD OF FORMING CAPPING/ARC LAYERS

(75) Inventors: Dawn M. Hopper, San Jose, CA (US); Lu You, San Jose, CA (US); Minh Van Ngo, Union City, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 73 days.

(21) Appl. No.: 09/819,987

(22) Filed: Mar. 29, 2001

(51) Int. Cl.$^7$ .......................................... H01L 21/4763
(52) U.S. Cl. ...................... 438/624; 438/623; 438/786; 257/759; 257/760
(58) Field of Search ................... 438/624, 622, 438/618, 786, 623, 763; 257/758, 759, 760

(56) References Cited

U.S. PATENT DOCUMENTS

| | | | |
|---|---|---|---|
| 4,756,977 A | 7/1988 | Haluska et al. | |
| 5,661,093 A | * 8/1997 | Ravi et al. | 438/763 |
| 5,930,655 A | * 7/1999 | Cooney, III et al. | 438/474 |
| 5,937,323 A | 8/1999 | Orczyk et al. | |
| 5,942,328 A | * 8/1999 | Grill et al. | 428/408 |
| 5,981,354 A | 11/1999 | Spikes et al. | |
| 6,001,730 A | 12/1999 | Farkas et al. | |
| 6,008,120 A | 12/1999 | Lee | |
| 6,150,258 A | * 11/2000 | Mountsier et al. | 438/623 |
| 6,218,299 B1 | * 4/2001 | Akahori et al. | 438/682 |
| 6,251,770 B1 | * 6/2001 | Uglow et al. | 438/624 |
| 6,291,334 B1 | * 9/2001 | Somekh | 438/620 |

OTHER PUBLICATIONS

"Solving the Integration Challenges of Low–K Dielectrics", L. Peters, Semiconductor International, Nov. 1999.
U.S. patent application No. 09/511,585.

* cited by examiner

Primary Examiner—Amir Zarabian
Assistant Examiner—Christy Novacek

(57) ABSTRACT

Degradation of fluorine-doped silica glass low-k inter-layer dielectrics during fabrication is significantly reduced and resolution of submicron features is improved by the formation of dual nature capping/ARC layers on inter-layer dielectric films. The capping/ARC layer is formed in-situ on a fluorine-doped silica glass inter-layer dielectric. The in-situ formation of the capping/ARC layer provides a strongly adhered capping/ARC layer, formed with fewer processing steps than conventional capping and ARC layers.

20 Claims, 6 Drawing Sheets

SEMICONDUCTOR DEVICES WITH DUAL NATURE CAPPING/ARC LAYERS ON FLUORINE DOPED SILICA GLASS INTER-LAYER DIELECTRICS AND METHOD OF FORMING CAPPING/ARC LAYERS

RELATED APPLICATIONS

This application contains m to subject matter disclosed in copending U.S. patent applications Ser. No. 09/817,050 filed on Mar. 27, 2001 and Ser. No. 09/817,615 filed on Mar. 29, 2001.

TECHNICAL FIELD

The present invention relates to a method of manufacturing a semiconductor device exhibiting reduced capacitance loading. The present invention has particular applicability in manufacturing high density, multi-level semiconductor devices comprising sub-micron dimensions and exhibiting high circuit speed.

BACKGROUND OF THE INVENTION

The escalating requirements for high density and performance associated with ultra large-scale integration (ULSI) semiconductor device wiring are difficult to satisfy in terms of providing sub-micron-sized, low resistance-capacitance (RC) metallization patterns. This is particularly applicable when the sub-micron-features, such as vias, contact areas, lines, trenches, and other shaped openings or recesses have high aspect ratios (depth-to-width) due to miniaturization.

Conventional semiconductor devices typically comprise a semiconductor substrate, usually of doped monocrystalline silicon (Si), and a plurality of sequentially formed inter-metal dielectric layers and electrically conductive patterns. An integrated circuit is formed therefrom containing a plurality of patterns of conductive lines separated by inter-wiring spacings, and a plurality of interconnect lines, such as bus lines, bit lines, word lines, and logic interconnect lines. Typically, the conductive patterns of vertically spaced metallization levels are electrically interconnected by vertically oriented conductive plugs filling via holes formed in the inter-metal dielectric layer separating the metallization levels, while other conductive plugs filling contact holes establish electrical contact with active device regions, such as a source/drain region of a transistor, formed in or on a semiconductor substrate. Conductive lines formed in trench-like openings typically extend substantially parallel to the semiconductor substrate. Semiconductor devices of such type according to current technology may comprise five or more levels of metallization to satisfy device geometry and microminiaturization requirements.

A commonly employed method for forming conductive plugs for electrically interconnecting vertically spaced metallization levels is known as "damascene"-type processing. Generally, this process involves forming a via opening in the inter-metal dielectric layer or inter-layer dielectric (ILD) between vertically spaced metallization levels which is subsequently filled with metal to form a via electrically connecting the vertically spaced apart metal features. The via opening is typically formed using conventional lithographic and etching techniques. After the via opening is formed, the via is filled with a conductive material, such as tungsten (W), using conventional techniques, and the excess conductive material on the surface of the inter-metal dielectric layer is then typically removed by chemical-mechanical planarization (CMP).

A variant of the above-described process, termed "dual damascene" processing, involves the formation of an opening having a lower contact or via opening section which communicates with an upper trench section. The opening is then filled with a conductive material to simultaneously form a contact or via in contact with a conductive line. Excess conductive material on the surface of the inter-metal dielectric layer is then removed by CMP. An advantage of the dual damascene process is that the contact or via and the upper line are formed simultaneously.

High performance microprocessor applications require rapid speed semiconductor circuitry, and the integrated circuit speed varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. If the interconnection node is routed over a considerable distance, e.g., hundreds of microns or more, as in submicron technologies, the interconnection capacitance limits the circuit node capacitance loading and, hence, the circuit speed. As integration density increases and feature size decreases, in accordance with submicron design rules, the rejection rate due to integrated circuit speed delays significantly reduces manufacturing throughput and increases manufacturing costs.

One way to increase the circuit speed is to reduce the resistance of a conductive pattern. Conventional metallization patterns are typically formed by depositing a layer of conductive material, notably aluminum (Al) or an alloy thereof, and etching, or by damascene techniques. Al is conventionally employed because it is relatively inexpensive, exhibits low resistivity and is relatively easy to etch. However, as the size of openings for vias/contacts and trenches is scaled down to the sub-micron range, step coverage problems result from the use of Al. Poor step coverage causes high current density and enhanced electromigration. Moreover, low dielectric constant polyimide materials, when employed as inter-metal dielectric layers, cause moisture/bias reliability problems when in contact with Al, and these problems have decreased the reliability of interconnections formed between various metallization levels.

One approach to improved interconnection paths in vias involves the use of completely filled plugs of a metal, such as W. Accordingly, many current semiconductor devices utilizing VLSI (very large scale integration) technology employ Al for the metallization level and W plugs for interconnections between the different metallization levels. The use of W, however, is attendant with several disadvantages. For example, most W processes are complex and expensive. Furthermore, W has a high resistivity, which decreases circuit speed. Moreover, Joule heating may enhance electromigration of adjacent Al wiring. Still a further problem is that W plugs are susceptible to void formation, and the interface with the metallization level usually results in high contact resistance.

Another attempted solution for the Al plug interconnect problem involves depositing Al using chemical vapor deposition (CVD) or physical vapor deposition (PVD) at elevated temperatures. The use of CVD for depositing Al is expensive and hot PVD Al deposition requires very high process temperatures incompatible with manufacturing integrated circuitry.

Copper (Cu) and Cu-based alloys are particularly attractive for use in VLSI and ULSI semiconductor devices, which require multi-level metallization. Cu and Cu-based alloy metallization systems have very low resistivities, which are significantly lower than W and even lower than those of previously preferred systems utilizing Al and its alloys. Additionally, Cu has a higher resistance to electromigration. Furthermore, Cu and its alloys enjoy a considerable cost advantage over a number of other conductive materials, notably silver (Ag) and gold (Au). Also, in contrast to Al and refractory-type metals (e.g., titanium (Ti), tantalum (Ta) and W), Cu and its alloys can be readily deposited at low temperatures by well-known "wet" plating techniques, such as electroless and electroplating techniques, at deposition rates fully compatible with the requirements of manufacturing throughput.

Electroless plating of Cu generally involves the controlled auto-catalytic deposition of a continuous film of Cu or an alloy thereof on a catalytic surface by the interaction of at least a Cu-containing salt and a chemical reducing agent contained in a suitable solution, whereas electroplating comprises employing electrons supplied to an electrode (comprising the surface(s) to be plated) from an external source (i.e., a power supply) for reducing Cu ions in solution and depositing reduced Cu metal atoms on the plating surface(s). In either case, a nucleation/seed layer is required for catalysis and/or deposition on the types of substrates contemplated herein. A physical vapor deposition technique, such as sputtering, is useful for depositing the nucleation/seed layer.

Another technique to increase the circuit speed is to reduce the capacitance of the inter-layer dielectrics. The speed of semiconductor circuitry varies inversely with the resistance (R) and capacitance (C) of the interconnection system. The higher the value of the R×C product, the more limiting the circuit speed. As integrated circuits become more complex and feature sizes and spacings become smaller, the integrated circuit speed becomes less dependent upon the transistor itself and more dependent upon the interconnection pattern. Thus, the performance of multi-level interconnects is dominated by interconnect at deep sub-micron regimes, e.g., less than about 0.18 micron.

The dielectric constant of materials currently employed in the manufacture of semiconductor devices for an ILD ranges from about 4.0 for dense silicon dioxide to over 8.0 for deposited silicon nitride. The value of the dielectric constant expressed herein is based upon a value of one for a vacuum. In an effort to reduce interconnect capacitance, dielectric materials with lower values of permittivity have been explored. The expression "low-k" material has evolved to characterize materials with a dielectric constant less than about 3.9.

One type of low-k material that has been explored is a group of flowable oxides, which are basically ceramic polymers, such as hydrogen silsesquioxane (HSQ). Such polymers and their use are disclosed in, for example, U.S. Pat. No. 4,756,977 and U.S. Pat. No. 5,981,354. HSQ-type flowable oxides have been considered for gap filling between metal lines because of their flowability and ability to fill small openings. HSQ-type flowable oxides have been found to be vulnerable to degradation during various fabrication steps, including plasma etching.

There are several organic low-k materials, typically having a dielectric constant of about 2.0 to about 3.8, which may offer promise for use as an ILD. Organic low-k materials which offer promise are carbon-containing dielectric materials such as FLARE 20™ dielectric, a poly(arylene) ether, available from Allied Signal, Advanced Micromechanic Materials, Sunnyvale, Calif.; BCB (divinylsiloxane bis-benzocyclobutene), and Silk™ or porous Silk™ dielectric, organic polymers available from Dow Chemical Co., Midland, Mich.; and organic-doped silica glasses (OSG) (also known as carbon-doped glasses) including Black-Diamond™ dielectric available from Applied Materials, Santa Clara, Calif., Aurora™ dielectric available from ASM America, Inc., Phoenix, Ariz., and Coral™ dielectric available from Novellus, San Jose, Calif.

In attempting to employ such carbon-containing low-k materials in interconnect technology, as for gap filling or as an ILD, it was found that their dielectric constant became undesirably elevated as a result of processing. For example, the dielectric constant of BCB was found to increase from about 2.6 to greater than about 4.

Another suitable type of low-k dielectrics are fluorine-doped silica glasses (FSG). FSG include dielectrics formed from precursor gases $SiF_4$, $SiH_4$, and $N_2O$ and dielectrics formed from the precursors $SiF_4$, tetraethylorthosilicate (TEOS), and $O_2$. Dielectrics formed from TEOS and $SiF_4$ are known as fluorinated TEOS or FTEOS. FSGs typically exhibit a dielectric constant to about 3.6. It is believed that fluorine lowers the dielectric constant of silicon oxide films because fluorine is an electronegative atom that decreases the polarizability of the overall SiOF network.

In addition to decreasing the dielectric constant, incorporating fluorine in silica layers can also improve the gap-filling properties of the deposited films. Because fluorine is an etching species, it is believed that fluorine etches the film as it is being deposited. The simultaneous deposition/etching effect preferentially etches the corners of the gap, keeping the gap open so that it could fill small gaps with void-free FSG.

Unfortunately, there are several problems associated with some FSG layers. One problem is that poorly formed FSG layer may absorb moisture from the atmosphere, or from the reaction products associated with the deposition. The absorption of water raises the dielectric constant of the FSG. Absorbed water may also interfere with subsequent wafer processing steps. For many applications, it is desirable that FSG layers do not desorb significant water vapor below about 450° C.

Another problem associated with some FSG layers is corrosion, if fluorine is loosely bound into the FSG lattice, or has accumulated as free fluorine on the surface, it may combine with water to form hydrofluoric acid (HF). HF may corrode, and even destroy, other device features such as metal traces or antireflective layers. One technique that is used to overcome the problems of corrosion is to form a liner over the substrate before depositing the FSG and sometimes a liner after FSG deposition. The liner is typically a thin layer of USG that acts as a barrier between device features and the FSG.

A further problem with some FSG layers are that they are unstable. In other words, the layer characteristics change over time. For example, fully formed FSG layers may form a cloudy haze, or even bubbles, within the layer when exposed to the atmosphere.

A problem associated with the use of many low-k dielectric materials is that these materials can be damaged by exposure to oxidizing or "ashing" systems, which remove a resist mask used to form openings, such as vias and trenches, in the low-k dielectric material. This damage can cause the surface of the low-k dielectric material to become a water absorption site, if and when the damaged surface is exposed to moisture. Subsequent processing, such as annealing, can result in water vapor formation, which can interfere with subsequent filling, with a conductive material, of a via/opening or a damascene trench formed in the dielectric layer.

Capping layers provide one method of reducing reabsorption of water into low-k dielectric layers. The capping layer is typically a silicon oxide layer that is deposited onto the low-k dielectric layer with or without baking the low-k dielectric layer prior to depositing the capping layer. The capping layer may be formed in a separate deposition chamber or pump-down or the process may be streamlined to follow the low-k dielectric layer deposition in the same chamber. The capping layer protects the upper surface of the low-k dielectric from damage during removal of the resist mask and thus inhibits water absorption under many conditions. Silicon oxide capping layers, however, require an additional process step of forming the silicon oxide layer.

One problem with using silicon oxide capping layer is that the silicon oxide capping layer does not adhere well to the carbon and fluorine-doped ILD surfaces. The poor adhesion of the capping layer to the ILD increases the likelihood of diffusion or leakage of conductive materials through the porous low-k ILD, which can lead to short circuits. In addition, both carbon and fluorine-doped low-k ILD also exhibit inadequate adhesion to underlying semiconductor substrates.

Antireflective coatings (ARC) are frequently employed to help provide submicron images during photomicrographic processing. The ARC cuts down on light scattering, which helps in the definition of small images, minimizes standing wave effects, and improves image contrast during photoresist exposure. However, the use of an ARC requires additional processing steps, including spin-on and baking steps. In addition ARC layers, along with capping layers, suffer from poor adhesion to the ILD surface.

The term semiconductor devices, as used herein, is not to be limited to the specifically disclosed embodiments. Semiconductor devices, as used herein, include a wide variety of electronic devices including flip chips, flip-chip/package assemblies, transistors, capacitors, microprocessors, and random access memories, etc. In general, semiconductor devices refer to any electrical device comprising semiconductors.

SUMMARY OF THE INVENTION

There exists a need for methodology enabling the use of low-k fluorine-containing dielectric materials as an ILD in high-density, multi-level connection patterns. There exists a particular need for methodology enabling the use of such low-k materials with low-k capping and ARC layers to avoid degradation of the low-k ILD properties while providing sub-micron feature sizes with enhanced resolution.

These and other needs are met by embodiments of the present invention, which provide a method of forming a semiconductor device with a first dielectric film on a semiconductor substrate. The first dielectric film is formed by depositing a lower layer of a fluorine-doped silica glass on a semiconductor substrate. A middle layer comprising a mixture of the fluorine-doped silica glass and a gradually increasing concentration of SiC is deposited on the lower layer and an upper layer of SiC is deposited on the middle layer. SiC has a lower dielectric constant than prior art ARC layers such as SiON.

The earlier stated needs are also met by other embodiments of the instant invention that provide a semiconductor device comprising a first dielectric film formed on a semiconductor substrate. The first dielectric film comprises a lower layer comprising a fluorine-doped silica glass, a middle layer comprising a mixture of fluorine-doped silica glass and a gradually increasing concentration of SiC, and an upper layer comprising SiC.

This invention address the needs for an improved method of forming capping layers and ARC layers on low-k ILD layers for use in high-density, multi-level interconnection patterns. This invention improves adhesion of capping layers and ARC layers to low-k ILD. The present invention enables the manufacturing of high reliability, small feature sized semiconductor devices.

The foregoing and other features, aspects, and advantages of the present invention will become apparent in the following detailed description of the present invention when taken in conjunction with the accompanying drawings.

DETAILED DESCRIPTION OF THE INVENTION

The present invention enables the production of semiconductor devices with improved performance and reduced feature sizes by depositing a low-k capping/ARC layer in-situ on an ILD or low-k ILD during formation of the ILD. These objectives are achieved by strategically varying the flow rates of the ILD precursor gases during ILD formation to gradually convert a low-k dielectric film into a capping/ARC layer. The present invention comprises one or more ILD films formed on a semiconductor substrate.

Figure 1:
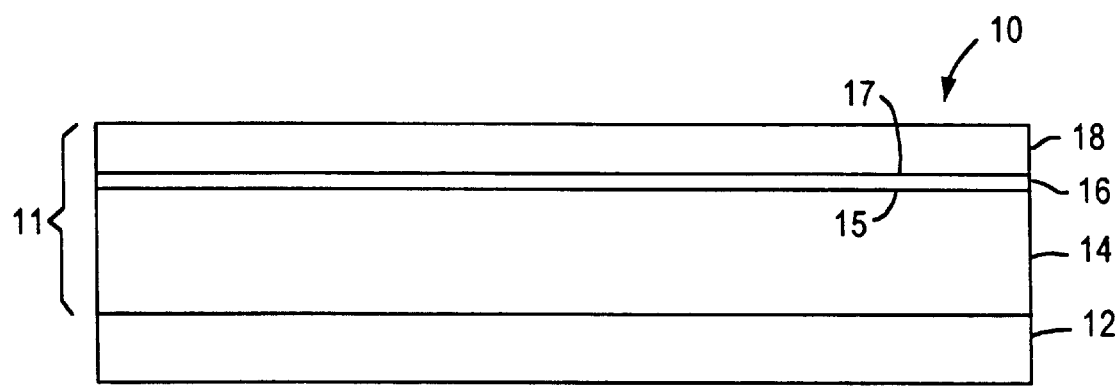
FIG. 1 illustrates a semiconductor device with a first dielectric film.

As illustrated in FIG. 1, as an example, a layer 14 of a fluorine-doped silica glass is formed on a semiconductor substrate 12. The fluorine-doped glass is formed by a plasma enhanced chemical vapor deposition (PECVD) process. The fluorine-doped dielectric is formed by flowing precursor gases $SiF_4$, $SiH_4$, and $N_2O$ over the semiconductor substrate 12, or alternatively, by flowing $SiF_4$, TEOS, and $O_2$ over the semiconductor substrate 12 to form FSG. FSG is deposited until a predetermined layer thickness is achieved. Nominal FSG layer thickness ranges from about 2,000 Å to about 1.2 µm.

For FTEOS deposition suitable PECVD reactor parameters include: $SiF_4$ flow rate of about 200 to about 2000 sccm; TEOS flow rate of about 500 to about 3000 sccm; $O_2$ flow rate of about 400 to about 800 sccm; pressure of about 2 to about 8 torr; high frequency RF power of about 50 to about 150 watts; low frequency RF power of about 200 to about 400 watts; and a temperature of about 300° C. to about 450° C.; for about 20 or more seconds depending on the desired thickness.

In certain embodiments, suitable reactor parameters include an $SiF_4$ flow rate of about 600 to about 1000 sccm; TEOS flow rate of about 800 to about 1100 sccm; temperature of about 350° C. to about 450° C.; pressure of about 2.5 to about 4.5 torr; and a spacing distance between the substrate and the plasma source of about 0.25 to about 0.80 cm.

The fluorine concentration in the FSG or FTEOS layer 14 ranges from about 5 atomic % to about 20 atomic %.

When the desired FSG layer 14 thickness is reached, the flow rate of $O_2$, $SiF_4$, and TEOS are gradually reduced and a methylsilane and argon (Ar) are introduced into the reactor to form a middle layer 16 comprising a mixture of FSG and a gradually increasing concentration of SiC. The decomposition of a methylsilane in an environment with a substoichiometric amount of oxygen produces SiCOH. SiCOH typically contains carbon in the amount of about 5 to about 20 atomic %, silicon in an amount of about 15 to about 25 atomic %, oxygen in an amount of about 25 to about 35 atomic %, and hydrogen in an amount of about 35 to about 45 atomic %. SiCOH contains SiC, SiH, CH and SiOH bonding.

The preferred methylsilanes include trimethylsilane and tetramethylsilane. For the purpose of describing the invention, trimethylsilane will be exemplified. The flow rate of trimethylsilane and Ar are gradually increased while the flow rate of the $SiF_4$, $O_2$, and TEOS are gradually reduced. As the $O_2$, $SiF_4$, and TEOS flow rates are gradually reduced and the flow rate of the trimethylsilane is gradually increased with respect to the flow rates of $O_2$, $SiF_4$, and TEOS, the amount of SiC formed increases. When the $O_2$, $SiF_4$, and TEOS flow rates are reduced to zero no FSG or SiCOH is deposited on the semiconductor substrate 12.

The thickness of the middle layer 16, which comprises a mixture of FSG, SiCOH, and SiC, ranges from about 25 Å to about 100 Å. Across the middle layer 16 thickness the SiC concentration ranges from about 0 wt. % at the lower layer/middle layer interface 15 to about 100 wt. % at the middle layer upper surface 17.

As shown in FIG. 1, a SiC dielectric film upper layer 18, is deposited to a thickness of about 300 Å to about 500 Å. After completing the deposition of SiC upper layer 18, semiconductor device 10, with a three-layer first dielectric film 11, is formed. SiC performs several functions. SiC can function as a capping layer for an ILD, an ARC, and an etch/polish stop. In the present invention the SiC dielectric film upper layer 18 functions as a combination capping/ARC layer, and additionally may function as a an etch/polish stop during etching and/or polishing operations. The dual nature of the capping/ARC layer 18 eliminates the necessity of forming an additional ARC layer, including the steps of spinning on the ARC and the ARC baking step, or a separate CVD deposition for CVD ARC film. Furthermore, the capping/ARC layer 18 is formed in the same chamber and as part of the same process as the fluorine-doped glass layer 14 and middle layer 16 deposition. Therefore, the formation of the three-layer first dielectric film 11 is more economical and time efficient over the prior art processes of forming separate capping layers and ARC layers over an ILD.

The gradual transition from the fluorine-doped silica glass 14 to the SiC upper layer 18 provides strong adhesion of the SiC upper layer 18 to the fluorine-doped silica glass 14.

Figure 2:
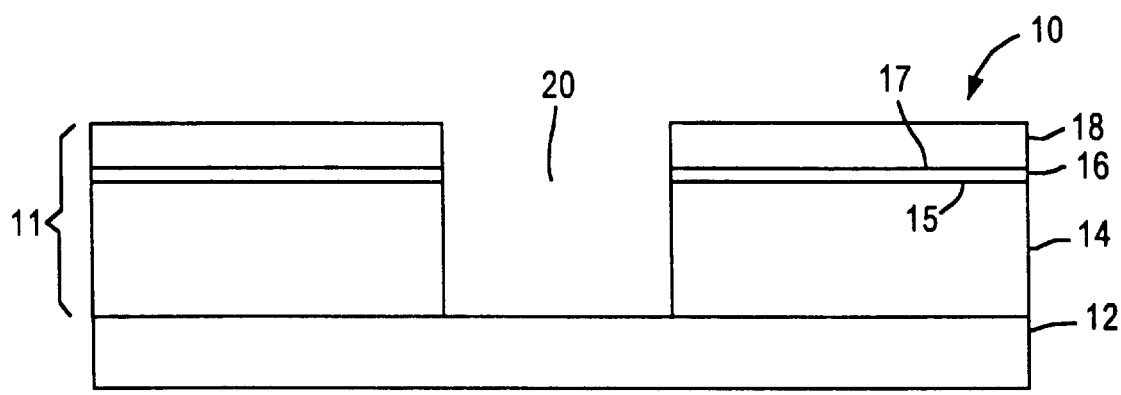
FIG. 2 illustrates an opening formed in the first dielectric film.

Interconnects are formed in the semiconductor device 10 by patterning the first dielectric film 11 to form a trench 20, as illustrated in FIG. 2. The trench 20 is formed by conventional photolithographic techniques; applying a photoresist, masking the photoresist, exposing the unmasked portions to actinic radiation, and subsequent development. The pattern formed in the photoresist (not shown) is subsequently transferred into the first dielectric film 11 by conventional anisotropic etching techniques to form the trench 20. The photoresist is then subsequently removed, as by $O_2$ ashing. The SiC capping/ARC layer 18 protects the fluorine-doped glass layer 14 from damage during the photoresist removal process, especially in the hard mask integration approach.

Figure 3:
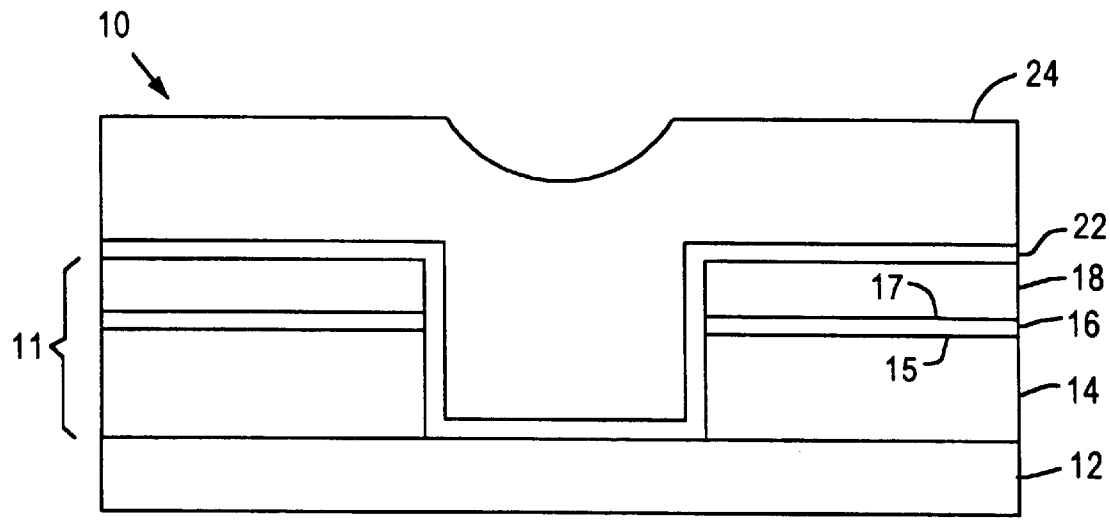
FIG. 3 illustrates filling the opening in the first dielectric film with a metal.

A damascene type interconnect is formed in the trench 20 by depositing a metal 24 into the trench 20, as shown in FIG. 3. The interconnect metal can be comprise a number of conventional metals including Al, Al alloys, Cu, Cu alloys and W. Cu and Cu alloys are preferred because of the high conductivity of Cu and its alloys. However, Cu is prone to diffusion in silicon based ILD. Therefore, when a metal comprising Cu is used as the interconnect, a barrier layer 22, as shown in FIG. 3, is first deposited on the dielectric film 11. Suitable conductive Cu barrier layers include Ta, TaN, Ti, TiN, and WN.

Figure 4:
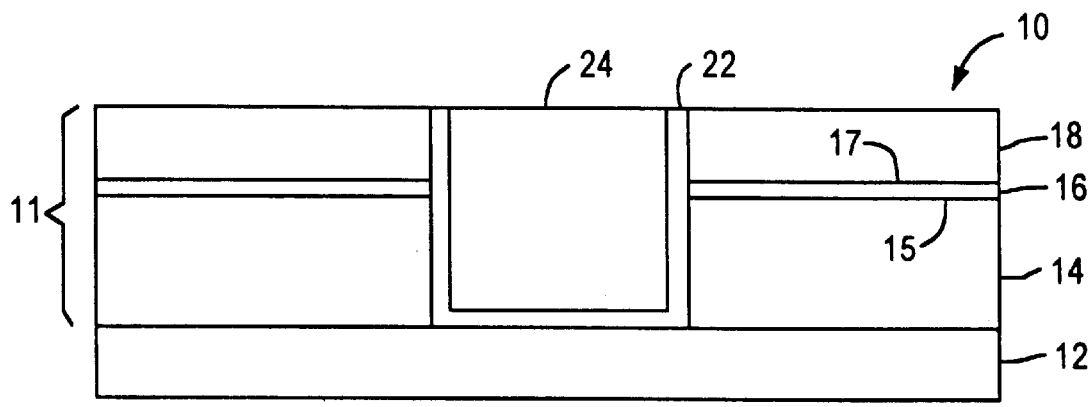
FIG. 4 illustrates a planarized semiconductor device with a damascene interconnect structure.

After the Cu barrier layer 22 is deposited, the trench is filled with Cu 24 using an electrolytic or electroless plating technique. However, before plating, a seed layer of Cu is deposited using either a chemical vapor deposition (CVD) technique or a physical vapor deposition (PVD) technique, such as sputtering, to form a thin seed layer (not shown) on which the Cu is deposited. In addition to filling the trench 20, the metal 24 and barrier layer 22 are also deposited on the first dielectric film 11 creating an overfill situation as shown in FIG. 3. After metal deposition, the semiconductor device 10 is planarized, as by a chemical-mechanical polishing technique (CMP) to remove the metal 24 overfill and the conductive barrier layer 22 from on top of the dielectric film 11. The resulting damascene structure is illustrated in FIG. 4. The SiC layer 18 further functions as a polish stop during CMP processing of the semiconductor device 10.

Figure 5:
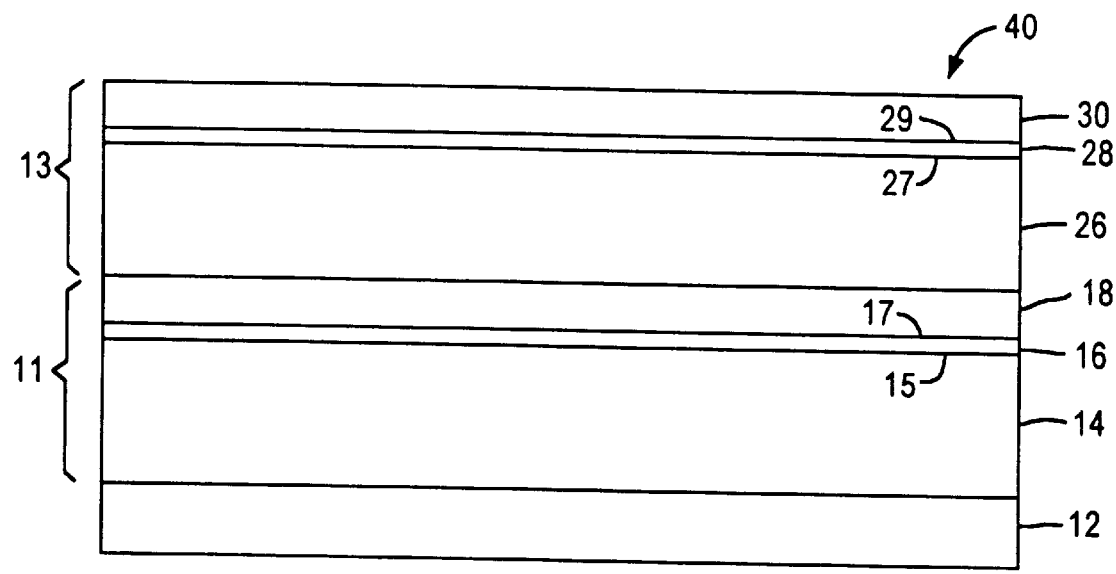
FIG. 5 illustrates a semiconductor substrate with first and second dielectric films formed.

The present invention is well-suited for forming dual damascene structures on semiconductor substrates. When forming the dual damascene structures, a second dielectric film 13, similar to the first dielectric film 11, is formed over the first dielectric film 11, as shown in FIG. 5. Second dielectric film 13 includes a fluorine-doped silica glass lower layer 26, middle layer 28 comprising a mixture of fluorine-doped silica glass and SiC, and upper layer 30 comprising SiC. The second dielectric film lower layer 26, middle layer 28, and upper layer 30 are formed in the same manner as the corresponding layers in the first dielectric film 11. As in first dielectric film middle layer 16, second dielectric film middle layer 28 comprises a gradually increasing concentration of SiC ranging from 0 weight % of SiC at the lower layer/middle layer interface 27 to about 100 weight % at the middle layer/upper layer interface 29. The thicknesses of the layers 26, 28, and 30 of second dielectric film 13 are within the same ranges as the corresponding first dielectric film 11 layers. The SiC layer 18 provides improved adhesion for the second dielectric film lower layer 26.

Figure 6:
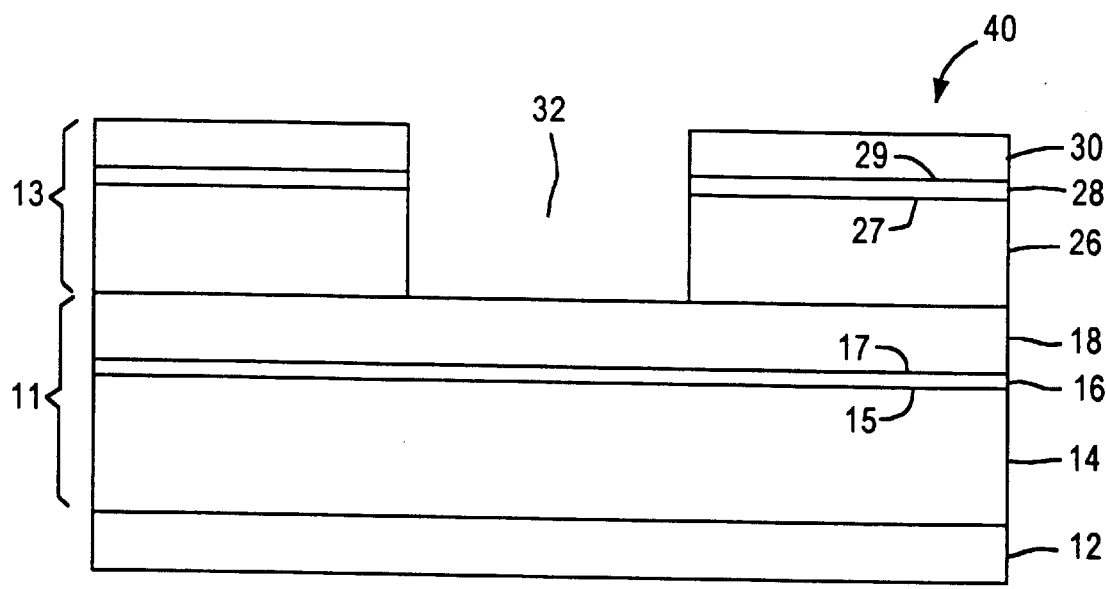
FIG. 6 illustrates a via formed in the second dielectric film.

A via opening 32 is formed in second dielectric film 13 using conventional photolithographic and anisotropic etching techniques, as shown in FIG. 6. In addition to its dual function as a capping and ARC layer, first dielectric film upper layer 18 also functions as an etch stop during formation of the via opening 32 in second dielectric film 13 and subsequent trench formation.

Figure 7:
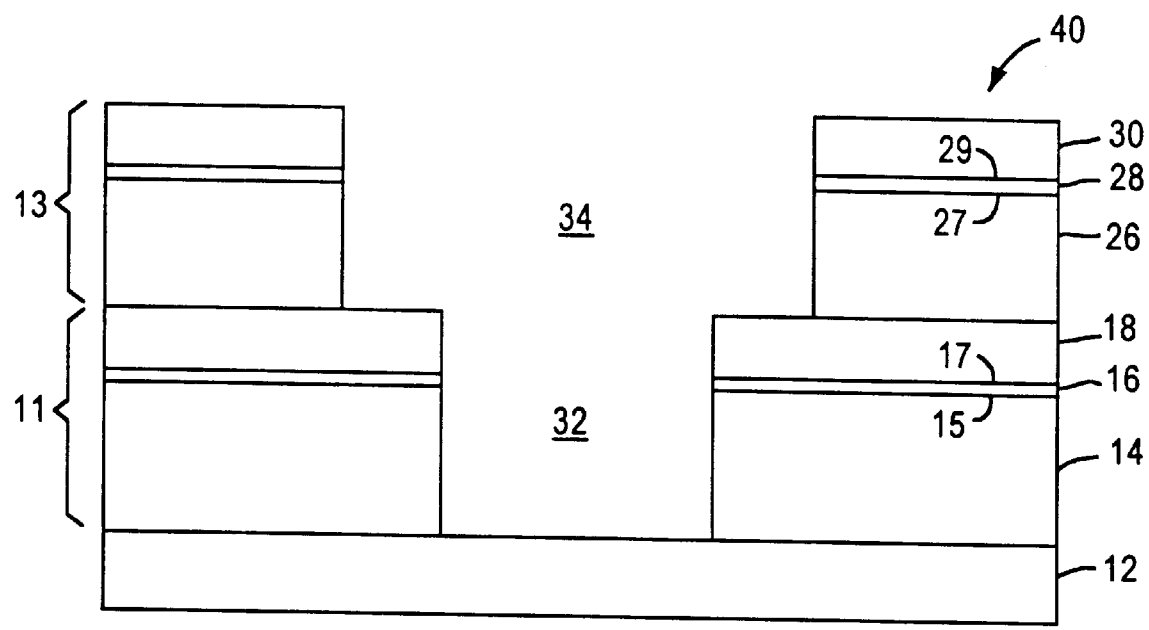
FIG. 7 illustrates a via and trench formed in the first and second dielectric films.

As shown in FIG. 7, trench 34 is formed in second dielectric film 13 and via opening 32 is continued through the first dielectric film 11, exposing a portion of the semiconductor substrate 12. As with previous patterning steps, conventional photolithographic and etching techniques are used to form the trench/via structure 34/32. For example, a bottom etch stop layer may be provided between the substrate 12 and the lower layer 14, as known in the art, to protect the substrate 12 during etching of the dielectric material. The bottom etch stop material may be SiN, for example.

Figure 8:
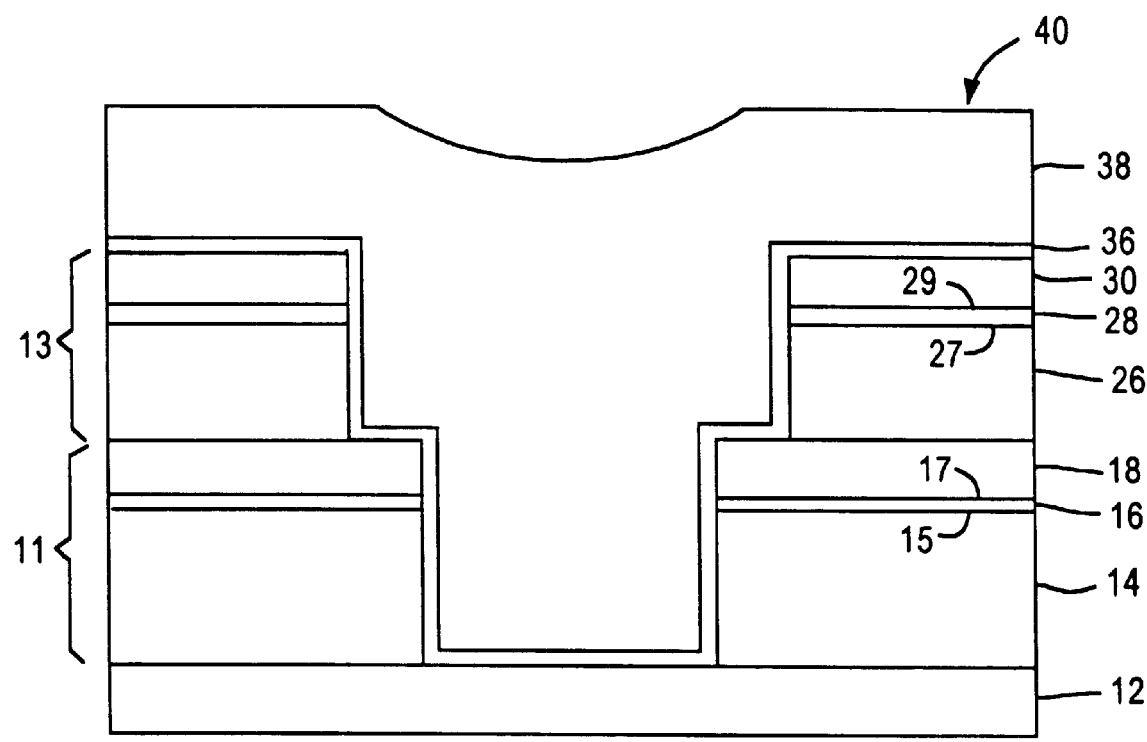
FIG. 8 illustrates the deposition of metal into the via and trench of the first and second dielectric films.
Figure 9:
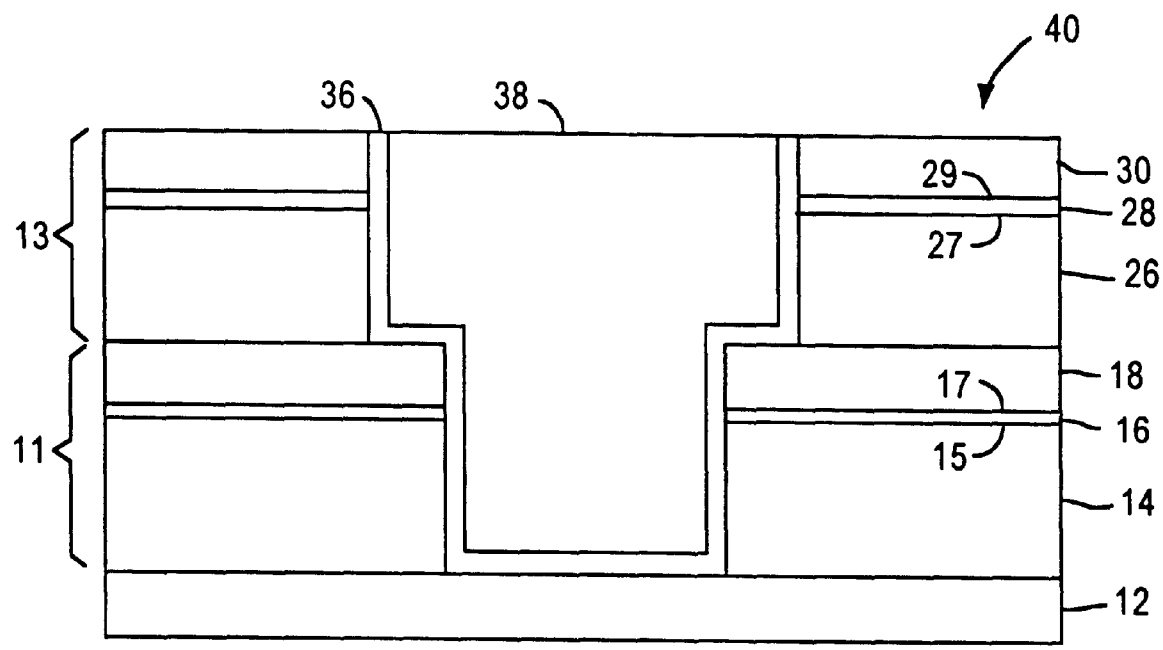
FIG. 9 illustrates a dual damascene interconnect structure formed on a semiconductor device.

As shown in FIG. 8, the trench/via structure 34/32 is filled with a conductive metal 38, preferably Cu or Cu alloy. When the metal 38 is Cu or a Cu alloy, barrier layer 36 is deposited prior to filling the combined trench/via structure 34/32 with metal 38. As discussed earlier, the metal overfill is removed and the conductive material 36, 38 is planarized, using a CMP technique, to form a device 40 with a dual damascene interconnect, as shown in FIG. 9.

The method of forming a semiconductor device, as described herein, provides an economical and reliable process of forming high-density, multiple level interconnects. The method and semiconductor device described efficiently utilizes low-k fluorine-doped silica glass ILD technology. The dual nature of the capping/ARC layer eliminates several process steps and layers, thereby providing a more economical and reliable process. The improved adhesion of the capping/ARC layer to the fluorine-doped silica glass layers improves the semiconductor device reliability and manufacturing yield.

The embodiments illustrated herein are for illustrative purposes only. They should not be construed to limit the scope of the claims. As is clear to one of ordinary skill in the art, the instant disclosure encompasses a wide variety of embodiments not specifically illustrated herein.

What is claimed is:

1. A method of forming a semiconductor device with a first dielectric film on a semiconductor substrate, wherein the first dielectric film is formed by the steps of:

depositing a lower layer of a fluorine-doped silica glass on a semiconductor substrate;

depositing a middle layer comprising a mixture of a fluorine-doped silica glass and a gradually increasing concentration of SiC; and depositing an upper layer of SiC on the middle layer.

2. The method according to claim 1, wherein the concentration of SiC in the middle layer ranges from about 0 weight % at a lower layer/middle layer interface to about 100 weight % at a middle layer/upper layer interface.

3. The method according to claim 1, further comprising patterning the first dielectric film to form an opening exposing a portion of the semiconductor substrate.

4. The method according to claim 3, further comprising depositing a metal comprising Cu or Al in the opening.

5. The method according to claim 4 wherein the metal comprises Cu and further comprising forming a barrier layer in the opening before depositing the metal.

6. A method according to claim 1, further comprising depositing a second dielectric film on the first dielectric film, wherein the second dielectric film is formed by:

depositing a second lower layer of a fluorine-doped silica glass on the first dielectric film;

depositing a second middle layer comprising a mixture of fluorine-doped silica glass and a gradually increasing concentration of SiC; and depositing an upper layer of SiC on the second middle layer.

7. The method according to claim 6, wherein the concentration of SiC in the second middle layer ranges from about 0 weight % at a second lower layer/middle layer interface to about 100 weight % at a second middle layer/upper layer interface.

8. The method according to claim 6, wherein the fluorine-doped silica glass is formed from $SiF_4$, $SiH_4$, and $N_2O$; or $SiF_4$, tetraethylorthosilicate, and $O_2$ precursors.

9. The method according to claim 8, further comprising forming a via opening in the first and second dielectric films and a trench in the second dielectric film, wherein the trench in the second dielectric film is formed about the via opening extending through the first dielectric film.

10. The method according to claim 9, further comprising depositing a metal in the trench and via opening, wherein the metal comprises Al or Cu.

11. The method according to claim 10, wherein the metal comprises Cu, and further comprising forming a barrier layer in the via opening and trench before depositing the metal.

12. A semiconductor device comprising a first dielectric film formed on a semiconductor substrate, wherein the first dielectric film comprises:

a lower layer comprising a fluorine-doped silica glass;

a middle layer on the lower layer and comprising a mixture of a fluorine-doped silica glass and a gradually increasing concentration of SiC; and an upper layer of SiC on the middle layer.

13. The semiconductor device of claim 12, wherein the concentration of SiC in the middle layer ranges from about 0 weight % at a lower layer/middle layer interface to about 100 weight % at a middle layer/upper layer interface.

14. The semiconductor device of claim 12, further comprising a metal filled trench formed in the first dielectric film, wherein the metal comprises Al or Cu.

15. The semiconductor device of claim 12, further comprising a second dielectric film formed on the first dielectric film; wherein the second dielectric film comprises:

a second lower layer comprising an fluorine-doped silica glass formed on the first dielectric film upper layer;

a second middle layer on the second lower layer and comprising a mixture of a fluorine-doped silica glass and a gradually increasing concentration of SiC; and a second upper layer of SiC on the second middle layer.

16. The semiconductor device of claim 15, wherein the concentration of SiC in the second middle layer ranges from about 0 weight % at a lower layer/middle layer interface to about 100 weight % at a middle layer/upper layer interface.

17. The semiconductor device of claim 15, further comprising a metal filled trench and via opening dual damascene structure formed in the first and second dielectric films.

18. The semiconductor device of claim 17, wherein the metal comprises Al or Cu.

19. The semiconductor device of claim 17, wherein the metal is Cu and further comprising a barrier layer underlying the metal.

20. The semiconductor device of claim 15, wherein the thicknesses of the first and second dielectric film middle layers are about 25 Å to about 100 Å and the thicknesses of the first and second dielectric film upper layers are about 300 Å to about 500 Å.

* * * * *